United States Patent [19]
Yen

[11] Patent Number: 5,305,878
[45] Date of Patent: Apr. 26, 1994

[54] PACKAGED OPTICAL PELLICLE

[76] Inventor: Yung-Tsai Yen, 196 Tuscaloosa Ave., Atherton, Calif. 94025

[21] Appl. No.: 42,089

[22] Filed: Apr. 1, 1993

[51] Int. Cl.$^5$ .............................................. B65D 85/38
[52] U.S. Cl. .................................. 206/316.1; 206/455; 355/122
[58] Field of Search ............... 206/316.1, 455; 428/14, 428/45; 355/122

[56] References Cited

U.S. PATENT DOCUMENTS

| | | |
|---|---|---|
| 150,497 | 5/1874 | Wagner et al. |
| 769,915 | 9/1904 | Nostrand |
| 1,012,382 | 12/1911 | Lundbeck |
| 2,165,539 | 7/1939 | Dahlgren |
| 3,049,224 | 8/1962 | Fredette et al. |
| 3,080,964 | 3/1963 | Robinson et al. |
| 3,082,453 | 3/1963 | Mutchler et al. |
| 3,135,384 | 6/1964 | Cozzolino |
| 3,272,422 | 9/1966 | Miller |
| 3,668,658 | 6/1972 | Flores et al. |
| 3,810,812 | 5/1974 | Koenig |
| 3,848,596 | 11/1974 | Pennau |
| 3,970,362 | 7/1976 | Laliberte |
| 4,015,708 | 4/1977 | Kelm |
| 4,053,049 | 10/1977 | Beauvais |
| 4,209,091 | 6/1980 | Lieberman |
| 4,252,846 | 2/1981 | Romesberg et al. |
| 4,298,120 | 11/1981 | Kaneko et al. |
| 4,401,209 | 8/1983 | Salmond et al. |
| 4,450,959 | 5/1984 | Sommer |
| 4,470,508 | 9/1984 | Yen |
| 4,537,813 | 8/1985 | Kuyel |
| 4,624,557 | 11/1986 | Winn |
| 4,634,270 | 1/1987 | Yokoo et al. |
| 4,697,701 | 10/1987 | Ying ................................. 206/316.1 |
| 4,737,387 | 4/1988 | Yen |
| 5,042,655 | 8/1991 | Beldyk et al. ..................... 206/316.1 |
| 5,168,993 | 12/1992 | Yen .................................. 206/316.1 |

FOREIGN PATENT DOCUMENTS 37222C 10/1978 Japan .

OTHER PUBLICATIONS

Technical Digest No. 15, Jul. 1969, Western Electric Package for Transporting Beam Lead Devices on a Substrate, W. R. Wanesky.

Electronic Materials Packaging, "The Ultimate Pellicle Package" Flyer Mar. 13, 1984, Advanced Semiconductor Products.

Primary Examiner—William I. Price
Attorney, Agent, or Firm—Kolisch Hartwell Dickinson McCormack & Heuser

[57] ABSTRACT

A packaged optical pellicle is provided which includes a pellicle made up of a pellicle membrane and a pellicle frame, and a pellicle package. The pellicle membrane is designed to be tensioned over and mounted to one side of the pellicle frame. A protective cover is removably mounted to the opposite side of the pellicle frame. The protective cover includes opposing portions which extend outwardly beyond the outer periphery of the pellicle frame. The pellicle package includes a base and a top, with the base having a centrally disposed recessed portion and a peripheral portion for supporting the opposing portions of the protective cover. The top of the pellicle package is adapted to fit onto the base, the top having engagement surfaces for engaging the opposing portions of the protective cover and biasing those portions onto the shoulder of the base. It is normal that the protective covering be in the form of a membrane which is of greater thickness than the pellicle membrane, but this is not a critical part of the invention. It is also typical that the engagement portions or surfaces of the top of the package extend in a manner parallel to the shoulder of the base. In any event, the present invention provides a packaging system in which the pellicle is supported such that the pellicle membrane is not contacted by any of the surfaces of the pellicle package during packaging, shipment, and removal from the package.

8 Claims, 3 Drawing Sheets

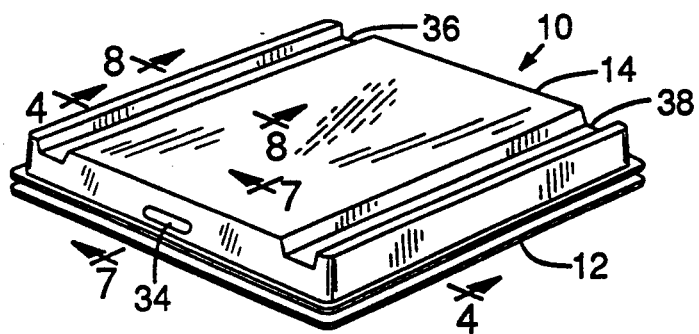
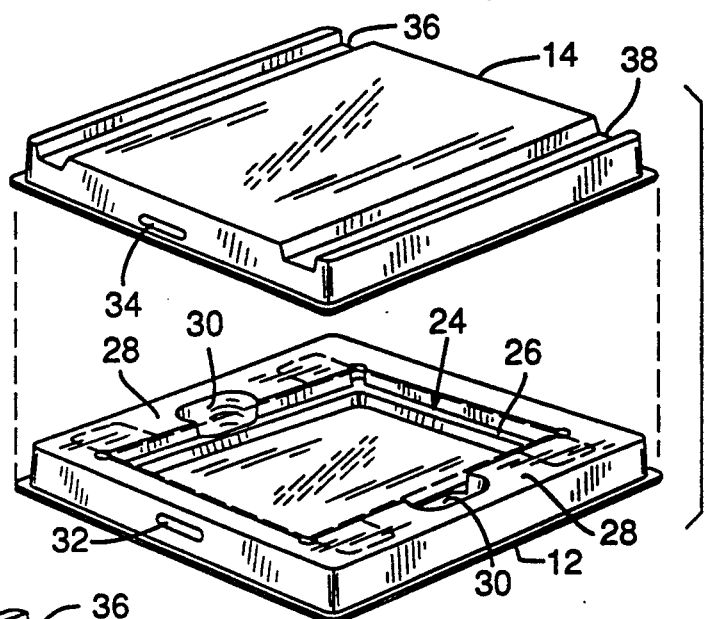
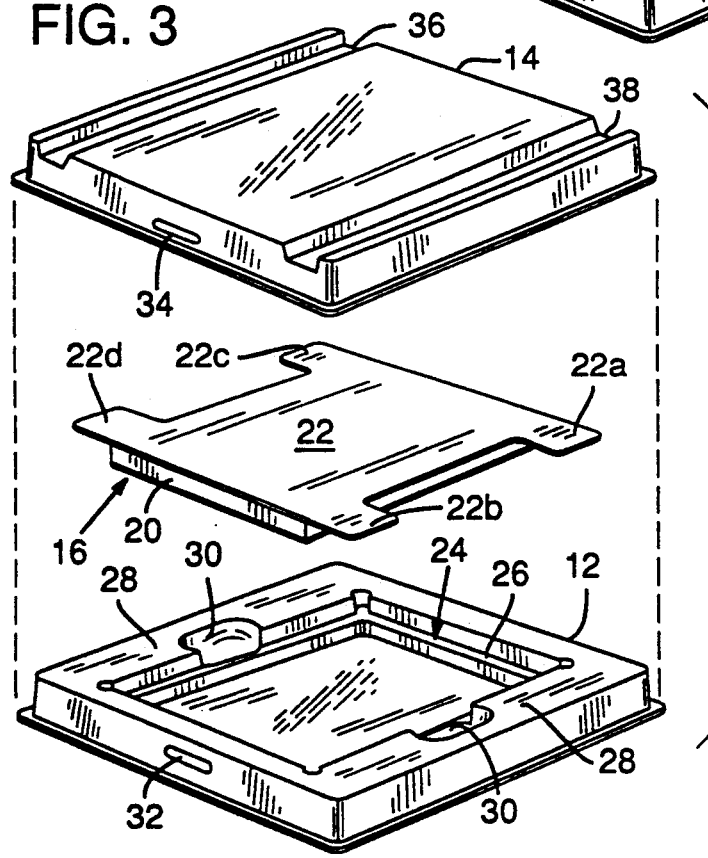

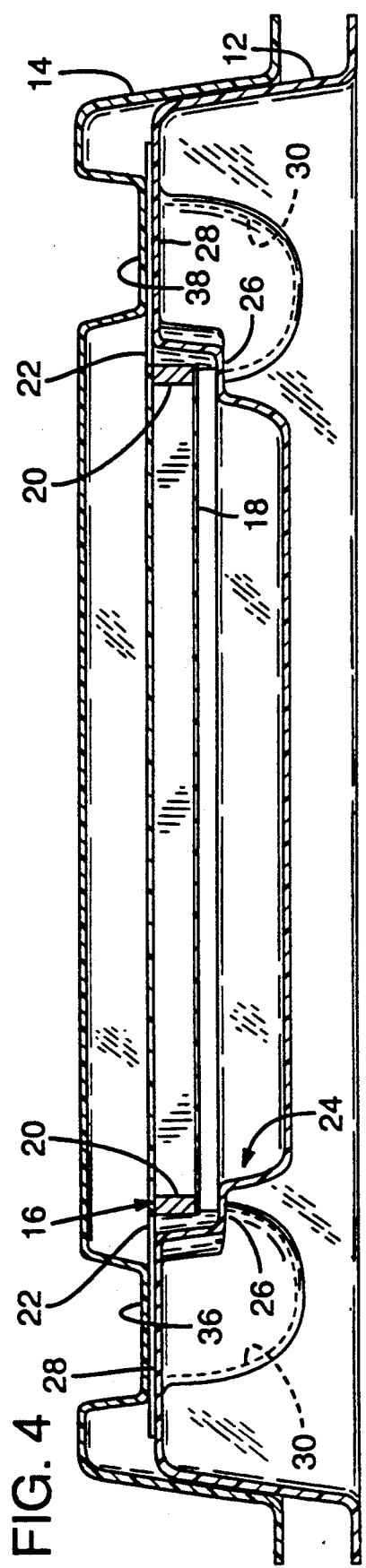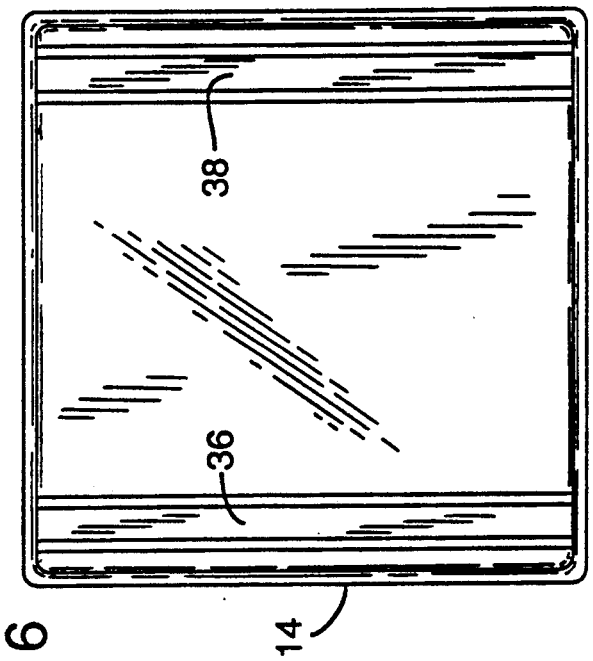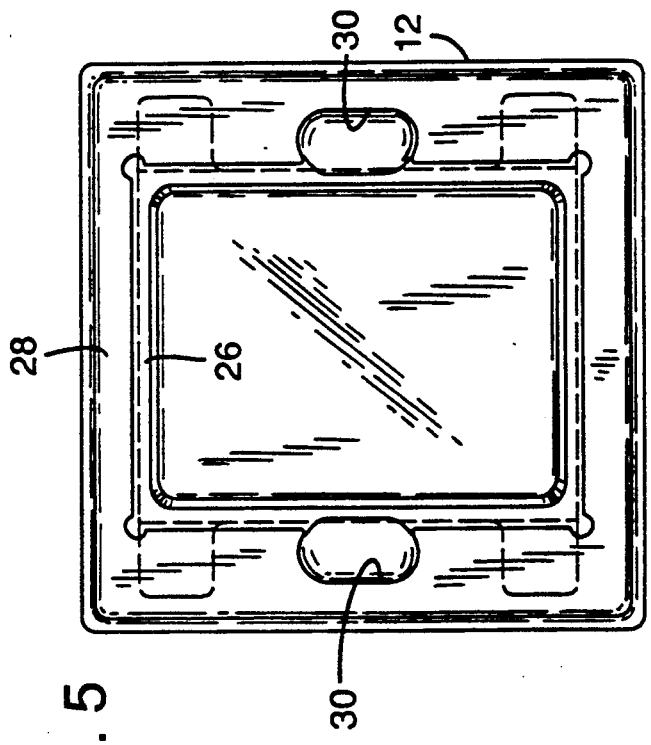

PACKAGED OPTICAL PELLICLE

BACKGROUND OF THE INVENTION

The present invention relates to optical pellicles, and more particularly to an optical pellicle packaging system.

In the semi-conductor chip industry it is well known that pattern transfer from the photomask to substrate is accomplished by exposing a mask to a light source. During the pattern transfer process, also called the photolithographic process, patterns on the photomask are projected onto the substrate which has been treated with a photosensitive substance. This results in the mask etchings being reproduced onto the substrate. Unfortunately, any foreign substance on the surface of the mask will also be reproduced on the substrate and therefore will interfere with proper pattern transfer to the substrate.

To eliminate contamination of the mask surface, a framed, thin membrane known as a pellicle is mounted on the mask surface, such that the pellicle membrane extends parallel to the mask at a predetermined distance spaced away from it. Any contamination which would ordinarily land on the mask surface instead falls onto the pellicle membrane.

Pellicles substantially eliminate the above problem because contamination on the pellicle membrane will not be projected onto the substrate. The frame of the pellicle supports the membrane at a distance spaced away from the mask surface so any particles or other contaminants on the pellicle membrane will be out of focus during pattern transfer.

The use of pellicles can increase the quality of the resulting circuit, thereby dramatically improving circuit fabrication productivity. Consequently, it is no surprise that pellicle manufacturing techniques have become increasingly important because high quality pellicles are critical to the success of the photolithographic process.

During the pellicle manufacturing process, it is important to minimize the possibility of either relatively large or small contaminant particles being deposited on the pellicle membrane. Relatively large particles are unacceptable because they may be reproduced in the substrate during photolithography even though they are out of focus. Equally unacceptable are particles (whether large or small) that are deposited on the underside of the pellicle membrane or the pellicle frame. Such particles may drop onto the mask surface during photolithography which is precisely what is to be avoided by using pellicles.

It is also critical that the pellicle membrane be extremely transparent and uniform across its surface. Because of this, pellicle membranes are normally extremely thin and are therefore quite fragile. Existing packaging systems often hold an optical pellicle in such a manner that the pellicle membrane itself is in contact with the pellicle package. This contact can damage the pellicle membrane in such a way that it is torn and is therefore not usable. It is also possible that the pellicle membrane can be damaged in the less visible fashion, but in such a way that particulate or other debris could rub off of the peripheral edges of the pellicle membrane which contact the package. This is a more dangerous type of damage, because it would not be immediately visible to the person who is involved in installing the pellicle onto a photomask. Such debris or particulate generated at the peripheral edges of the pellicle membrane could fall directly onto the more centrally disposed portions of the pellicle membrane, or worse yet, could become deposited on the photomask. In either event, there is a serious possibility that the existence of such particular could reduce the performance of the photolithography operation, event though the reason for having an optical pellicle is to improve the productivity of such operations.

One conventional packaging system such as that described above is disclosed in U.S. Pat. No. 4,697,701 to Ming Haw Ying. It can be seen in FIG. 3 of this patent that the top of the package directly contacts the peripheral portions of the optical pellicle membrane.

Thus, it is an object of the present invention to develop a pellicle packaging system which avoids the drawbacks and limitations of the prior art proposals. More specifically, the invention has as an object to develop a packaging system in which the pellicle membrane itself is not in contact with any portion of the packaging system, so to prevent any damage to the pellicle membrane during packaging, transport, and unpackaging of the pellicle. It is also an object of the present invention to develop a pellicle packaging system which is inexpensive to fabricate, which is extremely clean, and which may be used by one having minimal amount of skill, education or training.

SUMMARY OF THE INVENTION

The present invention provides a packaged optical pellicle which includes a pellicle and a pellicle package. The pellicle is comprised of a pellicle membrane having an inwardly facing side and an outwardly facing side, and a pellicle frame having a pellicle membrane side and a cover side. The pellicle membrane is designed to be mounted to the pellicle membrane side of the pellicle frame. A protective cover is removably mounted to the cover side of the pellicle frame, the protective cover including opposing portions which extend beyond the outer periphery of the pellicle frame.

The pellicle package includes a base and a top. The base has a centrally disposed recessed portion and a peripheral shoulder portion for supporting the opposing portions of the protective cover. The top is adapted to fit onto the base of the pellicle package, the top having an engagement portion for engaging the opposing portions of the protective cover and biasing those opposing portions toward the shoulder of the base.

It is normal that the protective cover is in the form of a membrane having a thickness substantially greater than that of the pellicle membrane. Normally, there are at least two opposing portions, although it is possible that the opposing portions are in the form of a continuously outwardly extending portion designed to rest on the shoulder.

Another aspect of the invention is a pellicle having, in addition to the pellicle membrane and the pellicle frame, a protective cover removably mounted to the opposite side of the pellicle frame, with the protective cover having opposing portions which extend beyond the outer periphery of the pellicle frame.

Yet another aspect of the invention is a method for packaging a pellicle using the pellicle protective cover having the outwardly extending portions.

Various other features, objects and advantages of the present invention will become more fully apparent as this description continues.

BRIEF DESCRIPTION OF THE DRAWINGS

FIG. 1 is an isometric view of a first embodiment of the present invention;

FIG. 2 is an isometric exploded view showing the embodiment of FIG. 1 except that the top of the pellicle package has been lifted off. The position of the pellicle is shown in phantom;

FIG. 3 is an isometric exploded view corresponding to the embodiment of FIG. 2 except that the pellicle with its protective cover is also depicted;

FIG. 4 is a side elevation sectional view taken along line 4—4 of FIG. 1;

FIG. 5 is a top plan view of the base of the pellicle package of the embodiment of FIG. 1;

FIG. 6 is a top plan view of the top of the pellicle package of the embodiment of FIG. 1;

DETAILED DESCRIPTION OF THE PREFERRED EMBODIMENTS

Figure 7:
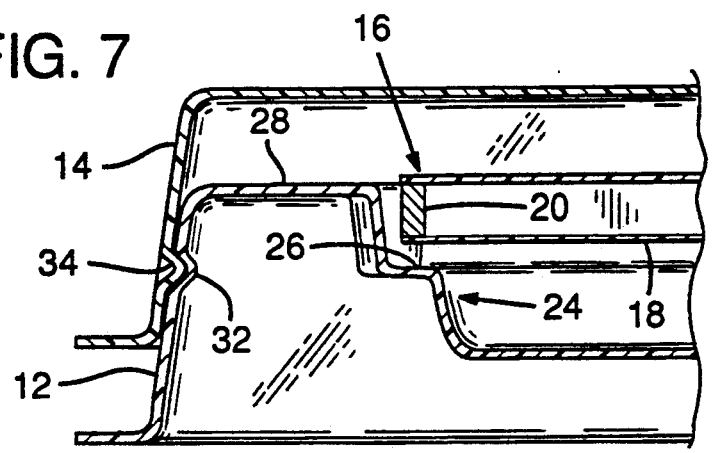
FIG. 7 is a side elevation sectional view taken along line 7—7 of FIG. 1.

The objects of this invention are best achieved by providing a packaged optical pellicle such as that depicted in FIGS. 1-8 at 10. This packaging system includes several different components. The package itself is made up of a base 12 and a top 14. The pellicle itself is shown generally at 16, and it includes a pellicle membrane 18, a pellicle frame 20 and a protective cover 22.

Figure 8:
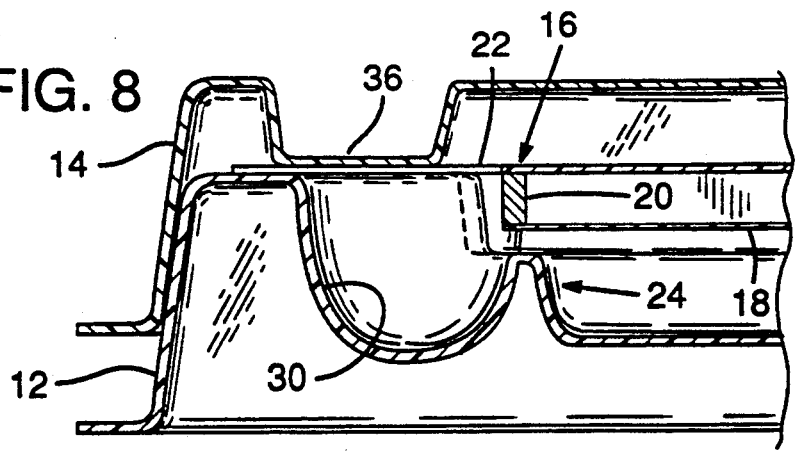
FIG. 8 is a side elevation sectional view taken along line 8—8 of FIG. 1.

The pellicle package will now be described in more detail. The base 12 of the pellicle package includes a centrally disposed recessed portion 24. This recessed portion 24 is designed to receive the pellicle 16 which depends downwardly from the protective cover, as best depicted in FIGS. 4 and 8. In the depicted embodiment the recessed portion is actually stepped at 26, but this is not a critical part of the invention. It is normal that an adhesive of some sort be applied to the floor of the recessed portion 24, as is well known in the art, but that adhesive is not depicted in the figures. The adhesive is designed to attract and retain any dust or other particulate which might otherwise come into contact with the pellicle membrane 18.

The base 12 also includes a peripherally extending shoulder 28 which normally extends in a coplanar fashion around the periphery of the base 12, surrounding the recessed portion 24.

Defined within the base 12 are a pair of finger depressions 30 which permit the pellicle to be pulled out of the base 12 by an operator using the thumb and index or middle finger. The base 12 also includes a pair of detents in the form of slot-like depressions 32 for engagement of the top 14 as will be described below.

The top 14 of the pellicle package is designed to fit over the base 12. In order to be engaged by the base, it also includes a pair of detents in the form of slat-like depressions 34 designed to engage corresponding depressions 32 in the base, and thereby permit the top to be engaged and held by the base. It is desirable that supplemental engagement means also be provided, normally in the form of adhesive tape (not shown) positioned on opposing sides of the pellicle package.

The inner surface of the top 14 also conventionally typically includes an adhesive coating (not shown), for dust-retention purposes.

All of the thus-far described aspects of the pellicle package are conventional in design. However, the top 14 also includes a pair of depressed engagement surfaces 36 and 38 which extend the length of the two sides of the top 14. These engagement surfaces 36 and 38 are configured relative to the spacing of detents 32 and 34 such that they are normally parallel and in close proximity to the shoulder 28 extending around the base 12. This configuration is perhaps best shown in FIG. 4.

The protective cover 22 for the pellicle 16 is removably mounted to the pellicle frame 20. The protective cover includes peripherally or outwardly extending opposing portions 22a, 22b, 22c and 22d, as best shown in FIG. 3. These opposing portions extend sufficiently far outwardly that once the pellicle 16 has been placed on the base 12 of the package, they will extend across at least a substantial portion of the peripheral shoulder 28 of the base. It is normal that these opposing portions will be of sufficient rigidity and thickness that they can support the weight of the pellicle, but this is not a critical feature of the invention because once the top 14 of the package is moved into engagement, the engagement surfaces 36 and 38 will hold the opposing portions 22a-d against the shoulder 28 such that movement of the pellicle will not be possible. Thus, as best shown in FIG. 4, the pellicle 16 will be suspended from the protective cover 22 such that the pellicle membrane 18 is not in contact with any part of the pellicle package. This will thus prevent damage to the pellicle membrane during the packaging, during shipment, and during unpackaging of the pellicle. The protective cover is normally fabricated of either 5 or 7.5 mil polyester, and is typically mounted to pellicle frame 20 by acrylic adhesive, such as 3M 966 marketed by Minnesota Mining and Manufacturing Co.

In order to unpackage or remove the pellicle from the pellicle package, the top 14 of package is first removed by merely pulling it off. The detents 32 and 34 are such that while they hold the top of the pellicle cover in place, it is relatively easy for one to pull the top away from the base. Once the top 14 has been removed from the base 12, the operator can, with one hand, remove the pellicle from the base 12 by placing the thumb and index or middle finger into the finger depressions 30 and removing the pellicle.

As mentioned above, the protective cover 22 has been removably mounted to the pellicle frame 20, so in order to mount the pellicle to the photomask, the protective cover 22 is merely peeled away from the pellicle frame, and the pellicle frame may then be placed directly onto the photomask. This may all be done without directly contacting or handling the pellicle membrane. Thus, from the time the pellicle is placed in the package until it is positioned onto the photomask, the pellicle membrane has never been touched either by the personnel handling the pellicle or by the package in which it has been shipped. Because of this, it is less likely than in existing systems that the pellicle membrane will be damaged or that particulate will be generated as a result of contact between the pellicle membrane and the package.

While a generally rectangular pellicle and package has been depicted, conventional pellicles also take other shapes, such as circular or more oblong in rectangular configuration. The present invention may be utilized with any of these systems. In the event of a round pellicle (not shown), the outwardly extending peripheral portions of the protective cover might extend around the entire periphery of the pellicle, or might be in the form of two or three or more projecting portions. In the case of a rectangular pellicle, there may be only two projecting portions, or there may be four or more, depending upon the desire of the designer, the strength or rigidity of the protective cover, and other factors.

In the depicted embodiment it is also shown that the top 14 of the pellicle package includes a pair of engagement surfaces 36 and 38 which extend across two opposing sides thereof. It should be understood that these engagement surfaces or engagement portions can take other configurations, and might be in the form of any type of projections which engage correspondingly positioned extensions on the protective cover.

It should be understood that these and other modifications to the preferred embodiments are within the spirit and scope of the present invention and the claims of this disclosure.

It is claimed and desired to secure by Letters Patent:

1. A packaged optical pellicle comprising:
   a pellicle membrane having an inwardly facing side and an outwardly facing side;
   a pellicle frame having a pellicle membrane side and a pellicle cover side, the inwardly facing side of the pellicle membrane being mounted to the pellicle membrane side of the pellicle frame;
   a protective cover removably mounted to the cover side of the pellicle frame, the protective cover including opposing portions which extend outwardly beyond the outer periphery of the pellicle frame;
   a pellicle package including a base and a top, the base including a centrally disposed recessed portion adapted to receive the pellicle frame with the pellicle membrane mounted thereon, and a peripheral shoulder portion for supporting the opposing portions of the protective cover, the top being adapted to fit onto the base, with engagement portions for engaging the opposing portions of the protective cover and biasing those portions toward the peripheral shoulder of the base.

2. The packaged optical pellicle of claim 1 wherein the protective cover comprises a membrane having a thickness which is greater than the pellicle membrane.

3. The packaged optical pellicle of claim 1 wherein the pellicle is generally rectangular in configuration, and opposing portions extend outwardly adjacent each corner thereof.

4. The packaged optical pellicle of claim 1 wherein the engagement portions of the top of the pellicle package extend in a direction generally parallel to the peripheral shoulder of the base.

5. The packaged optical pellicle of claim 1 wherein the base of the pellicle package defines a plurality of notches disposed between the opposing portions of the pellicle cover, the notches being adapted to facilitate removal of the pellicle therefrom.

6. In an optical pellicle having a pellicle membrane mounted to one side of a pellicle frame, a protective cover removably mounted to the opposite side of the pellicle frame, the protective cover including opposing portions which extend substantially beyond the outer periphery of the pellicle frame.

7. The optical pellicle of claim 6 wherein the protective cover is in the form of a membrane having a thickness greater than that of the pellicle membrane.

8. A method of packaging an optical pellicle having a pellicle membrane mounted to one side of a pellicle frame, comprising:
   applying a protective cover to the opposite side of the pellicle frame, the protective cover including opposing portions which extend substantially beyond the outer periphery of the pellicle frame;
   positioning the pellicle in the base of a pellicle package having a centrally disposed recessed portion adapted to receive a pellicle frame, and a peripheral shoulder portion adapted to support the opposing portions of the protective cover; and
   positioning a top of the pellicle package over the base thereof, the top including engagement surfaces which extend in a manner parallel to the peripheral shoulder of the base so that the opposing portions of the protective cover are engaged between the shoulder portion of the base and the engagement portions of the top of the pellicle package.

* * * * *